United States Patent [19]

Limisimaque

[11] Patent Number: 4,870,574
[45] Date of Patent: Sep. 26, 1989

[54] METHOD FOR THE PROGRAMMING OF DATA IN AN ELECTRICALLY PROGRAMMABLE READ-ONLY MEMORY

[75] Inventor: Gilles Limisimaque, Peynier, France

[73] Assignee: Thomson Semiconducteurs, Paris, France

[21] Appl. No.: 65,554

[22] Filed: Jun. 23, 1987

[30] Foreign Application Priority Data

Jun. 27, 1986 [FR] France ................. 86 09355

[51] Int. Cl.⁴ ................. G06F 12/00; G11C 7/00
[52] U.S. Cl. ................. 364/300; 364/965; 364/965.81; 365/189.09
[58] Field of Search ................. 364/200, 300, 900; 365/185, 189, 194, 226

[56] References Cited

U.S. PATENT DOCUMENTS

| | | | |
|---|---|---|---|
| 4,173,791 | 11/1979 | Bell | 365/182 |
| 4,325,130 | 4/1982 | Tiltscher | 364/900 |
| 4,412,310 | 10/1983 | Korsh et al. | 365/185 |
| 4,616,339 | 10/1986 | Cuppens et al. | 365/185 |
| 4,644,250 | 2/1987 | Hartgring | 365/226 X |

OTHER PUBLICATIONS

New Electronics, vol. 15, No. 3, Feb. 1982, pp. 46-50, London, G.B., P. Harold: "Production E.P.R.O.M. Loading".

Primary Examiner—Raulfe B. Zache
Attorney, Agent, or Firm—Oblon, Spivak, McClelland, Maier & Neustadt

[57] ABSTRACT

The invention pertains to the programming of electrically programmable read-only memories (EPROM, EEPROM) made in the form of integrated circuits. To optimize the data programming process, two stages are planned: the first stage is a conventional but short programming stage, designed to memorize data during a relatively short period of time. In the second stage, is a longer repeat programming stage performed in a way which is internal to the integrated circuit, i.e. the data is read in the memory and re-recorded at the same places without its being necssary to apply this data again to the inputs of the integrated circuits.

2 Claims, 2 Drawing Sheets

METHOD FOR THE PROGRAMMING OF DATA IN AN ELECTRICALLY PROGRAMMABLE READ-ONLY MEMORY

BACKGROUND OF THE INVENTION

1. Field of the Invention

The present invention pertains to the programming of data in an electrically programmable read-only memory which is part of an integrated circuit.

The application more particularly considered here is that of "memory cards", namely cards comprising an integrated circuit with an electrically programable read-only memory.

2. Description of the Prior Art

The term "electrically programmable read-only memory" refers to a memory in which it is possible to record data by applying appropriate electrical signals at the input of the integrated circuit comprising the memory, this data then remaining recorded in the memory even in the absence of the electrical power for a long period known as a retention period. This period may be as long as several years.

In many applications considered for memory cards, the cards must be produced in very large numbers and data to be recorded on each card may comprise a large number of bits, for example eight kilobits.

Now the programming of each bit, or each octet if the programming is done octet by octet, takes up an amount of time which, although short, is not negligible.

For example, it was first thought that the programming of an octet had to be done by applying a programming voltage Vpp for a period of fifty milliseconds. This period is, in fact, is far greater than needed, but which includes a safety margin making it certain that a retention period of 10 years will be obtained.

To reduce the programming period, it has been proposed to ascertain, immediately after writing, that the transistors which constitute the memory have received a sufficient electrical charge to ensure the retention period. With this check, it is possible to do away the application of a programming voltage with a very high safety margin as used to be done before. In practice, it is possible to carry out the programming operation for 2 milliseconds, read the result (for a few microseconds), start again if the result is wrong and do the programming again for 4 milliseconds, for safety, if the result is right.

However, this programming cycle is still too long when millions of cards have to be programmed: for the manufacturer who programmes the cards, the time is prohibitive.

This is why, it has been thought that the tasks of programming could be pushed on to the user (instead of the manufacturer). Since each user has a smaller number of cards to programme, the problem of time is less critical.

However, this solution cannot be considered in certain cases where the data to be recorded is confidential and must absolutely be recorded by the manufacturer: for example, when the information pertains to the identification of the user and should not be recorded by the user himself.

To resolve the problem of the programming duration, the invention proposes a simple method in which the programming is done in two stages: in a first stage, the manufacturer programmes the data for a very small period which is, however, sufficient for the data to be retained until the second programming stage; during the second stage, which involves the user rather than the manufacturer, the memory is re-programmed, not with data applied again at the input of the integrated circuit which incorporates the memory, but with data already present in the memory, without making this data accessible for reading from outside the integrated circuit and without allowing it to be modified from the outside. This second stage is performed for a programming duration which is as long as is needed to obtain the final retention period desired (for example 10 years).

SUMMARY OF THE INVENTION

More precisely, the invention proposes a method for programming an electrically programmed read-only memory which forms part of an integrated circuit, a method comprising the two following main stages:

(1) In a first stage, the data to be written in the memory is applied at the inputs of the integrated circuit, and each datum is programmed by applying a programming voltage for a duration which is shorter than would be necessary to obtain the final retention time desired for this data but which is, nonetheless, sufficient to ensure a retention of data until the second stage, (2) In a second stage, each datum is routinely re-programmed by applying a programming voltage for a duration which is sufficient to obtain the final retention time desired, this re-programming being done by a programming means internal to the integrated circuit, which reads the data in the memory and re-records it, without the data being again applied to the inputs of the integrated circuit, whether from outside the circuit or from inside.

DESCRIPTION OF THE PREFERRED EMBODIMENT

Figure 1:
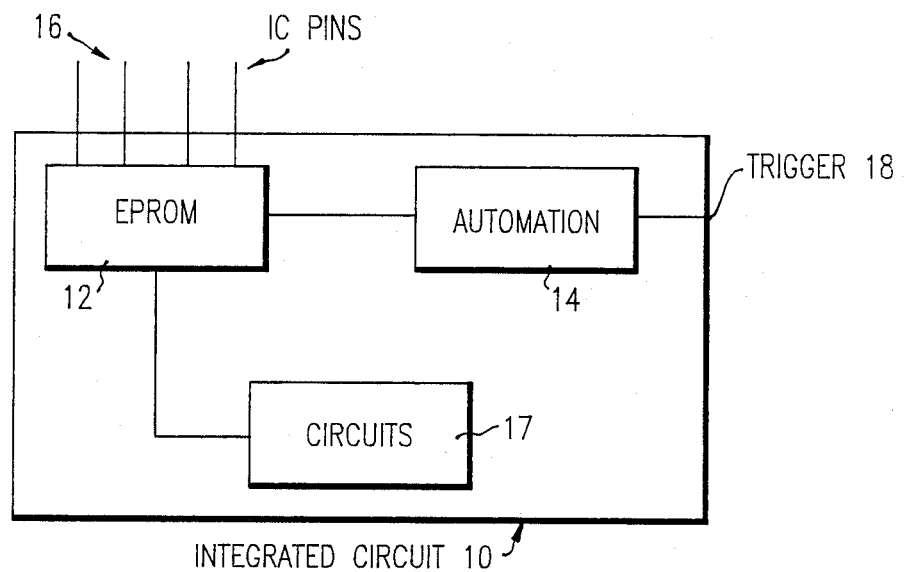
FIG. 1 is a block diagram of the apparatus to accomplish the programming method of the present invention.

The method according to the invention is not specific to a special type of memory or a special type of integrated circuit; it simply pertains to non-volatile memories for which the data retention time may be increased (at least within a certain range) by increasing the duration for which a programming voltage Vpp is applied.

This is the case with most non-volatile memories in which the data is stored in the form of locally trapped electrical charges, for example, charges trapped in a floating gate or in an interface between two insulating layers.

In one example of an embodiment, the integrated circuit 10 comprises essentially the programmable read-only memory 12, associated with a small number of specific circuits 17 (such as comparators, counters, adders, etc.) for data processing.

In this case, for the application of the invention, a writing automaton 14 is provided for in the integrated circuit, with the function of carrying out the second part of the programming operation. This automaton successively reads each datum in the memory, bit by bit or word by word, and re-records the datum read at the same position, without changing its value. The actuation of this writing automaton is triggered, for example, from outside 18 the integrated circuit, but the coupling between the reading automaton and the memory during the reading and re-writing is done without the data that has been read and re-written appearing at the external terminals 16 of the circuit.

In another example of an embodiment, the integrated circuit comprises a microprocessor, namely a circuit capable of carrying out many different functions, defined by instructions received in the form of logic signals. The sequences of instructions received define a succession of tasks executed successively by the microprocessor. The sequences are, for example, stored in a read-only memory of programmes (most often programmed by mask). Among the instructions possible, the microprocessors always possess reading or writing instructions in memories.

In this case, it is planned to store, in the read-only memory of programmes, a sequence of instructions for reading and re-writing, datum by datum, in the electrically programmable read-only memory, this sequence being triggered by an appropriate instruction given to the microprocessor from the external terminals of the integrated circuit. Here again, during the execution of this sequence, the data read and then re-recorded in the memory by the microprocessor remains inside the integrated circuit and does not appear at the external terminals. An internal data bus, insulated from the external terminals during the execution of this sequence, is therefore provided for between the microprocessor and the electrically programmable memory.

Whether the integrated circuit comprises a microprocessor or not, it is possible to provide for either automatic means to trigger the second programming stage or for a triggering operation controlled by the signal applied to an external terminal of the integrated circuit (or several signals forming an instruction for the microprocessor).

Figure 2:
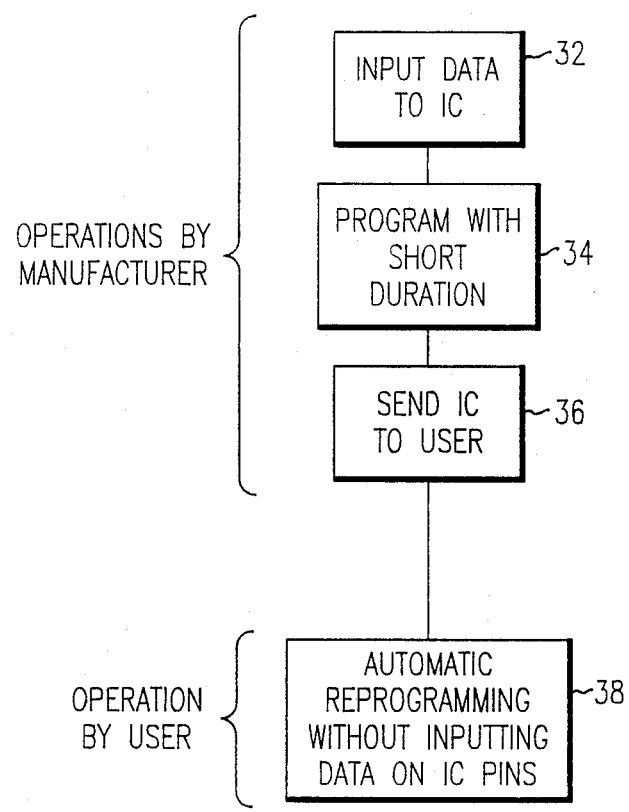
FIG. 2 is a flowchart of the programming operation according to the present invention.

FIG. 2 illustrates flowchart operation divided into a section which is operated by the manufacturer involving the inputting of data to a IC at step 32 followed by a programming for a predetermined duration which is shorter than the normal duration in order to provide retention at step 34 which is of a sufficient length of time until the automatic reprogramming 38 is accomplished by the user in another section. Once the step 34 has been accomplished, the IC can be sent to the user as illustrated at 36 and then the automatic reprogramming without inputting data on the IC pins is accomplished at 38 whether by the automatic operation or by triggering as shown in FIG. 1.

For example, if the integrated circuit is incorporated into a money transaction card, the card reader may give the appropriate triggering signals when the card is revalidated by a bank.

Or again, if the memory comprises a reference bit designed to have a smaller data retention time than that of the other bits of the memory, the disappearance from the programming of this reference bit can be used to trigger the second programming stage.

What is claimed is;

1. A method for programming an electrically programmable read-only memory which forms part of an integrated circuit, said method comprising the steps of:
    applying data to be written in the memory to inputs of said integrated circuit and applying a programming voltage for a first predetermined duration which is less than a second predetermined duration which second predetermined duration is theoretically necessary for obtaining a final desired retention for the said data in said memory and wherein said first predetermined duration is sufficient to ensure a retention of data for a intermediate retention time which is less than said final desired retention time;
    reprogramming by applying a programming voltage for a duration which is sufficient to obtain said final desired retention time wherein said reprogramming is effected by a programming means internal to said integrated circuit and wherein said reprogramming includes reading said data written in said memory and rewriting said data in said memory wherein said step of rewriting said data is accomplished without the said data being applied to said inputs of said integrated circuit, whether from outside said integrated circuit or from inside said integrated circuit.

2. Method according to claim 1, wherein said step of writing data in said memory is accomplished during manufacturing and wherein said reprogramming step is accomplished by a user of said integrated circuit.

* * * * *

UNITED STATES PATENT AND TRADEMARK OFFICE
CERTIFICATE OF CORRECTION

PATENT NO. : 4,870,574
DATED : Sep. 26, 1989
INVENTOR(S) : Gilles Lisimaque

It is certified that error appears in the above-identified patent and that said Letters Patent is hereby corrected as shown below:

Title page:

The inventor's last name is incorrectly recorded "Gilles Limisimaque" should be:

--Gilles Lisimaque--

Signed and Sealed this

Eleventh Day of December, 1990

Attest:

HARRY F. MANBECK, JR.

Attesting Officer

Commissioner of Patents and Trademarks